US006879155B2

(12) United States Patent
Ehman et al.

(10) Patent No.: US 6,879,155 B2
(45) Date of Patent: Apr. 12, 2005

(54) MAGNETIC RESONANCE ACOUSTOGRAPHY

(75) Inventors: Richard L.. Ehman, Rochester, MN (US); Philip J. Rossman, Rochester, MN (US)

(73) Assignee: Mayo Foundation For Medical Education and Research, Rochester, MN (US)

( * ) Notice: Subject to any disclaimer, the term of this patent is extended or adjusted under 35 U.S.C. 154(b) by 201 days.

(21) Appl. No.: 10/119,972

(22) Filed: Apr. 10, 2002

(65) Prior Publication Data

US 2003/0193336 A1 Oct. 16, 2003

(51) Int. Cl.[7] .................................................. G01V 3/00
(52) U.S. Cl. ...................................................... 324/309
(58) Field of Search ................................ 324/300, 307, 324/309; 600/410

(56) References Cited

U.S. PATENT DOCUMENTS

| 4,812,760 | A | | 3/1989 | Bottomley et al. |
| 5,309,099 | A | | 5/1994 | Irarrazabal et al. |
| 5,517,992 | A | | 5/1996 | Opsahl et al. |
| 5,592,085 | A | | 1/1997 | Ehman |
| 5,800,354 | A | * | 9/1998 | Hofland et al. ............. 600/410 |
| 5,825,186 | A | | 10/1998 | Ehman et al. |
| 5,899,858 | A | | 5/1999 | Muthupillai et al. |
| 5,977,770 | A | * | 11/1999 | Ehman ....................... 324/318 |
| 6,067,465 | A | * | 5/2000 | Foo et al. ................... 600/410 |
| 6,246,895 | B1 | | 6/2001 | Plewes |
| 6,320,378 | B1 | * | 11/2001 | Maier et al. ................ 324/307 |
| 6,541,971 | B1 | * | 4/2003 | Dannels ..................... 324/309 |

* cited by examiner

Primary Examiner—Edward Lefkowitz
Assistant Examiner—Dixomara Vargas
(74) Attorney, Agent, or Firm—Quarles & Brady LLP

(57) ABSTRACT

Magnetic resonance acoustography images are acquired in real time using a one-dimensional magnetic resonance elastography (MRE) pulse sequence in which a column of tissue is excited. A spin-echo MRE pulse sequence and a gradient-echo MRE pulse sequence are described which employ a broadband motion sensitizing gradient that enables an asynchronous transducer to be used to produce the oscillatory stress in the subject tissues.

20 Claims, 8 Drawing Sheets

MAGNETIC RESONANCE ACOUSTOGRAPHY

BACKGROUND OF THE INVENTION

The field of the invention is nuclear magnetic resonance imaging methods and systems. More particularly, the invention relates to the enhancement of MR image contrast.

The physician has many diagnostic tools at his or her disposal which enable detection and localization of diseased tissues. These include x-ray systems that measure and produce images indicative of the x-ray attenuation of the tissues and ultrasound systems that detect and produce images indicative of tissue echogenicity and the boundaries between structures of differing acoustic properties. Nuclear medicine produces images indicative of those tissues which absorb tracers injected into the patient, as do PET scanners and SPECT scanners. And finally, magnetic resonance imaging ("MRI") systems produce images indicative of the magnetic properties of tissues. It is fortuitous that many diseased tissues are detected by the physical properties measured by these imaging modalities, but it should not be surprising that many diseases go undetected.

Historically, one of the physician's most valuable diagnostic tools is palpation. By palpating the patient a physician can feel differences in the compliance or "stiffness", of tissues and detect the presence of tumors and other tissue abnormalities. Unfortunately, this valuable diagnostic tool is limited to those tissues and organs which the physician can feel, and many diseased internal organs go undiagnosed unless the disease happens to be detectable by one of the above imaging modalities. Tumors (e.g. of the liver) that are undetected by existing imaging modalities and cannot be reached for palpation through the patient's skin and musculature, are often detected by surgeons by direct palpation of the exposed organs at the time of surgery. Palpation is the most common means of detecting tumors of the prostate gland and the breast, but unfortunately, deeper portions of these structures are not accessible for such evaluation. An imaging system that extends the physician's ability to detect differences in tissue compliance throughout a patient's body would extend this valuable diagnostic tool.

Any nucleus which possesses a magnetic moment attempts to align itself with the direction of the magnetic field in which it is located. In doing so, however, the nucleus precesses around this direction at a characteristic angular frequency (Larmor frequency) which is dependent on the strength of the magnetic field and on the properties of the specific nuclear species (the magnetogyric constant γ of the nucleus). Nuclei which exhibit this phenomena are referred to herein as "spins", and materials which contain such nuclei are referred to herein as "gyromagnetic".

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. A net magnetic moment $M_z$ is produced in the direction of the polarizing field, but the randomly oriented magnetic components in the perpendicular, or transverse, plane (x-y plane) cancel one another. If, however, the substance, or tissue, is subjected to a magnetic field (excitation field $B_1$) which is in the x-y plane and which is near the Larmor frequency, the net aligned moment, Mz, may be rotated, or "tipped", into the x-y plane to produce a net transverse magnetic moment $M_t$, which is rotating, or spinning, in the x-y plane at the Larmor frequency. The practical value of this phenomenon resides in the signal which is emitted by the excited spins after the excitation signal $B_1$ is terminated. There are a wide variety of measurement sequences in which this nuclear magnetic resonance ("NMR") phenomena is exploited.

When utilizing NMR to produce images, a technique is employed to obtain NMR signals from specific locations in the subject. Typically, the region which is to be imaged (region of interest) is scanned by a sequence of NMR measurement cycles which vary according to the particular localization method being used. The resulting set of received NMR signals are digitized and processed to reconstruct the image using one of many well known reconstruction techniques. To perform such a scan, it is, of course, necessary to elicit NMR signals from specific locations in the subject. This is accomplished by employing magnetic fields ($G_x$, $G_y$, and $G_z$) which are superimposed on the polarizing field Bo, but which have a gradient along the respective x, y and z axes By controlling the strength of these gradients during each NMR cycle, the spatial distribution of spin excitation can be controlled and the location of the resulting NMR signals can be identified.

It is well known that NMR can be used to detect and image the movement of spins. As disclosed in U.S. Pat. No. Re. 32,701 entitled "NMR Scanner With Motion Zeugmatography", acquired NMR signals can be sensitized to detect moving spins by applying a bipolar magnetic field gradient at the proper moment in each NMR measurement sequence. The phase of the resulting NMR signal measures the velocity of spins along the direction of the motion sensitizing magnetic field gradient. With more complex motion sensitizing magnetic field gradients, higher orders of motion, such as acceleration and jerk can also be measured with this method.

One application that uses a bipolar gradient to sensitize the NMR to spin motion is diffusion weighted imaging as described in U.S. Pat. Nos. 4,809,801 and 5,092,335. A large bipolar gradient is applied to impart a phase shift to moving spins. In those tissues where fluids are diffusing in random directions, the spins have corresponding random phase. When an image is reconstructed based on the amplitude, or "modulus", of the acquired NMR signals, therefore, the signal intensity will be lower in regions where diffusion is occurring due to the phase dispersion of the NMR signals from those regions. The phase of NMR signals produced by stationary tissues are unaffected by the bipolar gradient and they remain at full brightness in the modulus image.

Standard magnetic resonance elastography (MRE) methods such as that disclosed in U.S. Pat. Nos. 5,825,186 and 5,592,085 allow for the imaging of mechanical properties of tissues. Two or three dimensional images are produced from MRE data that is typically acquired over many minutes of time. In addition, the typical MRE acquisition employs a motion sensitizing gradient that is synchronized with a mechanical stimulation device that produces stress in the subject at a single frequency. Indeed, as disclosed in U.S. Pat. No. 5,899,858, the motion sensitizing gradient waveform can be shaped to desensitize the MRE measurements to other frequencies.

SUMMARY OF THE INVENTION

The present invention is a method for producing and displaying MRE images in substantially real time. The MRE data is acquired using a one-dimensional pulse sequence which excites a column of spins in a subject, the excited spins are subjected to a motion sensitizing gradient and the acquired one-dimensional array of complex k-space data is Fourier transformed to form a one-dimensional image of the excited spins. A one-dimensional phase image is calculated from the complex image. A phase difference image is rendered on a display by subtracting a reference phase image produced when no motion is present from a phase image produced when a shear wave is propagating through the subject. The process is repeated to produce the phase images in substantially real time (e.g., 10 to 20 image frames/second).

An object of the invention is to produce MRE images in real time. By exciting a column of spins and performing a 1D MRE pulse sequence, no phase encodings are required and the entire 1D image can be acquired in a single pulse sequence in tens of milliseconds.

Another object is to provide a display format for 1D MRE images acquired in real time. Each 1D phase image is displayed graphically as a plot of phase amplitude as a function of distance along the excitation axis of the excited column of spins. In addition, each 1D phase image is rendered as a color coded line on the display which is positioned adjacent to previously produced images to form a waterfall display.

Another object of the invention is to provide an MRE pulse sequence which is sensitive to transient spin motion or motion with energy at multiple frequencies. This is accomplished by using a motion sensitizing gradient having a waveform containing frequency components over a desired range of frequencies. If the MRE measurement is made while subjecting the subject to oscillating stress produced by a motion transducer, there is no need to synchronize the transducer and the sensitizing gradient if the motion transducer operates in the sinc waveform frequency range.

Another object of the invention is to provide audio feedback of the mechanical response of tissues to an oscillating stress. By applying an oscillating stress to the subject at an audio frequency, the phase amplitudes measured around any location along the excited column can be monitored in real time and used to produce a corresponding audio tone. This non-invasive "virtual hydrophone" provides an audio tone to the operator which may change in frequency and amplitude as it is moved around in the subject.

The foregoing and other objects and advantages of the invention will appear from the following description. In the description, reference is made to the accompanying drawings which form a part hereof, and in which there is shown by way of illustration a preferred embodiment of the invention. Such embodiment does not necessarily represent the full scope of the invention, however, and reference is made therefore to the claims herein for interpreting the scope of the invention.

DESCRIPTION OF THE PREFERRED EMBODIMENT

Figure 1:
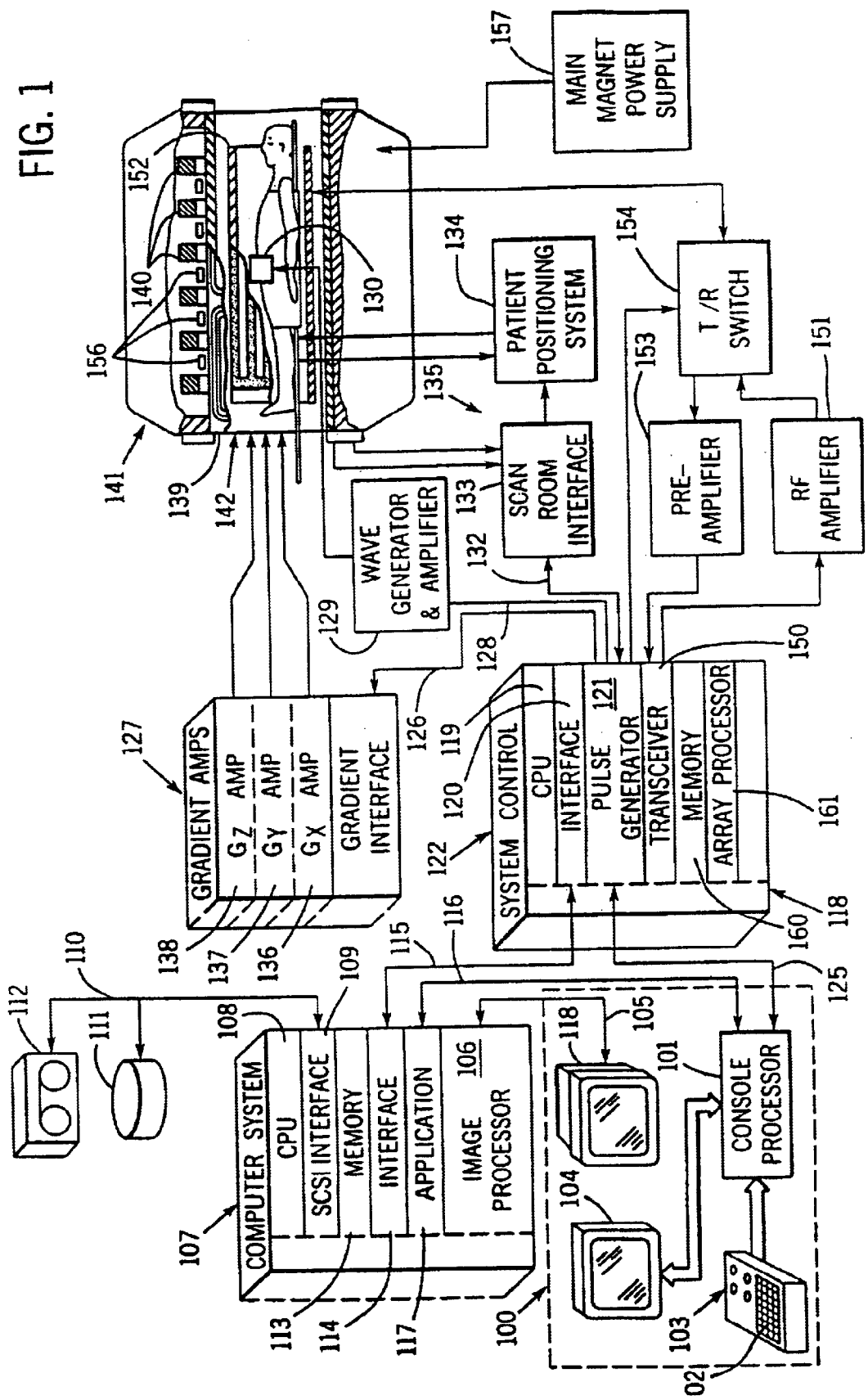
FIG. 1 is a block diagram of an NMR system which employs the present invention.

Referring first to FIG. 1, there is shown the major components of a preferred NMR system which incorporates the present invention and which is sold by the General Electric Company under the trademark "SIGNA". The operation of the system is controlled from an operator console 100 which includes a console processor 101 that scans a keyboard 102 and receives inputs from a human operator through a control panel 103 and a plasma display/touch screen 104. The console processor 101 communicates through a communications link 116 with an applications interface module 117 in a separate computer system 107. Through the keyboard 102 and controls 103, an operator controls the production and display of images by an image processor 106 in the computer system 107, which connects directly to a video display 118 on the console 100 through a video cable 105.

The computer system 107 includes a number of modules which communicate with each other through a backplane. In addition to the application interface 117 and the image processor 106, these include a CPU module 108 that controls the backplane, and an SCSI interface module 109 that connects the computer system 107 through a bus 110 to a set of peripheral devices, including disk storage 111 and tape drive 112. The computer system 107 also includes a memory module 113, known in the art as a frame buffer for storing image data arrays, and a serial interface module 114 that links the computer system 107 through a high speed serial link 115 to a system interface module 120 located in a separate system control cabinet 122.

The system control 122 includes a series of modules which are connected together by a common backplane 118. The backplane 118 is comprised of a number of bus structures, including a bus structure which is controlled by a CPU module 119. The serial interface module 120 connects this backplane 118 to the high speed serial link 115, and pulse generator module 121 connects the backplane 118 to the operator console 100 through a serial link 125. It is through this link 125 that the system control 122 receives commands from the operator which indicate the scan sequence that is to be performed.

The pulse generator module 121 operates the system components to carry out the desired scan sequence. It produces data which indicates the timing, strength and shape of the RF pulses which are to be produced, and the timing of and length of the data acquisition window. The pulse generator module 121 also connects through serial link 126 to a set of gradient amplifiers 127, and it conveys data thereto which indicates the timing and shape of the gradient pulses that are to be produced during the scan.

In one embodiment of the invention the pulse generator module 121 also produces sync pulses through a cable 128 to a wave generator and amplifier 129. The wave generator 129 produces a waveform which may be synchronized to the frequency and phase of the received sync pulses and this waveform is output though a 300 watt, dc coupled audio amplifier. A frequency in the range of 50 Hz to 1000 Hz is produced depending on the particular object being imaged, and it is applied to a transducer 130. The transducer 130 structure depends on the particular anatomy being measured and imaged. In general, however, the transducer 130 produces a force, or pressure, which oscillates and produces a corresponding oscillating stress in the gyromagnetic media (i.e. tissues) to which it is applied.

And finally, the pulse generator module 121 connects through a serial link 132 to scan room interface circuit 133 which receives signals at inputs 135 from various sensors associated with the position and condition of the patient and the magnet system. It is also through the scan room interface circuit 133 that a patient positioning system 134 receives commands which move the patient cradle and transport the patient to the desired position for the scan.

The gradient waveforms produced by the pulse generator module 121 are applied to a gradient amplifier system 127 comprised of $G_x$, $G_y$ and $G_z$ amplifiers 136, 137 and 138, respectively. Each amplifier 136, 137 and 138 is utilized to excite a corresponding gradient coil in an assembly generally designated 139. The gradient coil assembly 139 forms part of a magnet assembly 141 which includes a polarizing magnet 140 that produces either a 0.5 or a 1.5 Tesla polarizing field that extends horizontally through a bore 142. The gradient coils 139 encircle the bore 142, and when energized, they generate magnetic fields in the same direction as the main polarizing magnetic field, but with gradients $G_x$, $G_y$ and $G_z$ directed in the orthogonal x-, y- and z-axis directions of a Cartesian coordinate system. That is, if the magnetic field generated by the main magnet 140 is directed in the z direction and is termed $B_0$, and the total magnetic field in the z direction is referred to as $B_z$, then $G_x = \partial B_z / \partial x$, $G_y = \partial B_z / \partial y$ and $G_z = \partial B_z / \partial z$, and the magnetic field at any point (x,y,z) in the bore of the magnet assembly 141 is given by $B(x,y,z) = B_0 + G_x x + G_y y + G_z z$. The gradient magnetic fields are utilized to encode spatial information into the NMR signals emanating from the patient being scanned, and as will be described in detail below, they are employed to measure the microscopic movement of spins caused by the pressure produced by the transducer 130.

Located within the bore 142 is a circular cylindrical whole-body RF coil 152. This coil 152 produces a circularly polarized RF field in response to RF pulses provided by a transceiver module 150 in the system control cabinet 122. These pulses are amplified by an RF amplifier 151 and coupled to the RF coil 152 by a transmit/receive switch 154 which forms an integral part of the RF coil assembly. Waveforms and control signals are provided by the pulse generator module 121 and utilized by the transceiver module 150 for RF carrier modulation and mode control. The resulting NMR signals radiated by the excited nuclei in the patient may be sensed by the same RF coil 152 and coupled through the transmit/receive switch 154 to a preamplifier 153. The amplified NMR signals are demodulated, filtered, and digitized in the receiver section of the transceiver 150. The transmit/receive switch 154 is controlled by a signal from the pulse generator module 121 to electrically connect the RF amplifier 151 to the coil 152 during the transmit mode and to connect the preamplifier 153 during the receive mode. The transmit/receive switch 154 also enables a separate RF coil (for example, a head coil or surface coil) to be used in either the transmit or receive mode.

In addition to supporting the polarizing magnet 140 and the gradient coils 139 and RF coil 152, the main magnet assembly 141 also supports a set of shim coils 156 associated with the main magnet 140 and used to correct inhomogeneities in the polarizing magnet field. The main power supply 157 is utilized to bring the polarizing field produced by the superconductive main magnet 140 to the proper operating strength and is then removed.

The NMR signals picked up by the RF coil 152 are digitized by the transceiver module 150 and transferred to a memory module 160 which is also part of the system control 122. An array processor 161 operates to Fourier transform this complex k-space data into an array of complex image data. This image data is conveyed through the serial link 115 to the computer system 107 where it is stored in the disk memory 111. In response to commands received from the operator console 100, this image data may be archived on the tape drive 112, or it may be further processed by the image processor 106 as will be described in more detail below and conveyed to the operator console 100 and presented on the video display 118.

Figure 2:
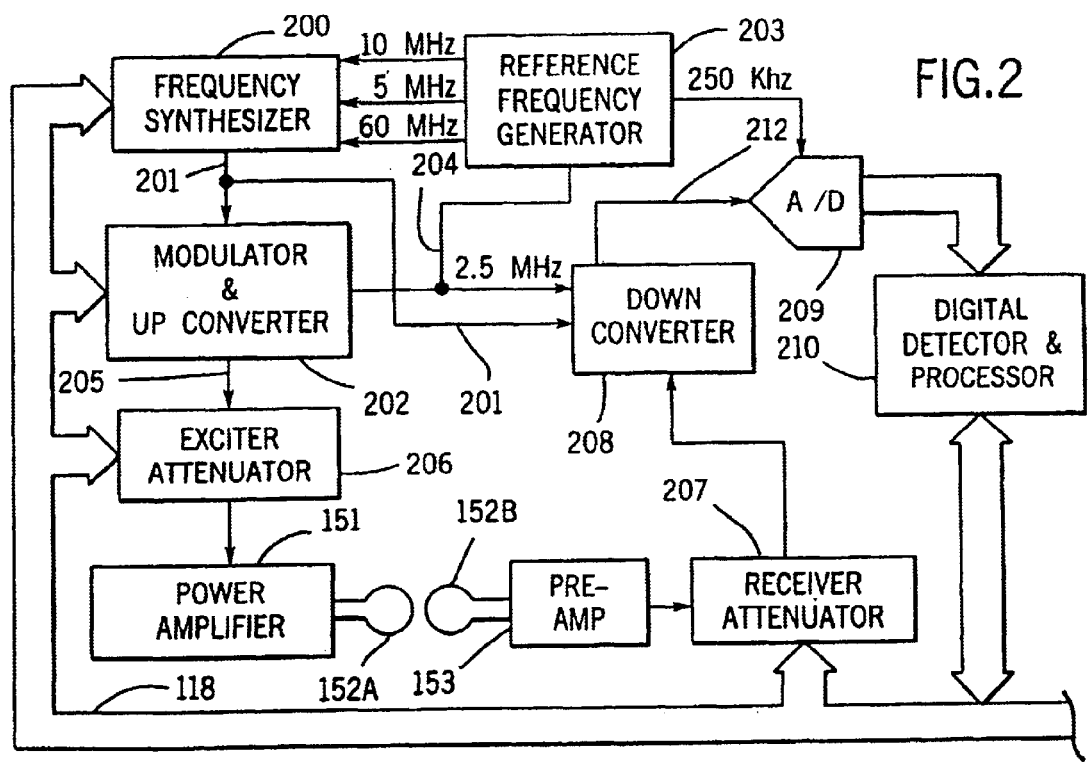
FIG. 2 is an electrical block diagram of the transceiver which forms part of the NMR system of FIG. 1.

Referring particularly to FIGS. 1 and 2, the transceiver 150 includes components which produce the RF excitation field $B_1$ through power amplifier 151 at a coil 152A and components which receive the resulting NMR signal induced in a coil 152B. As indicated above, the coils 152A and B may be separate as shown in FIG. 2, or they may be a single whole body coil as shown in FIG. 1. The base, or carrier, frequency of the RF excitation field is produced under control of a frequency synthesizer 200 which receives a set of digital signals (CF) through the backplane 118 from the CPU module 119 and pulse generator module 121. These digital signals indicate the frequency and phase of the RF carrier signal which is produced at an output 201. The commanded RF carrier is applied to a modulator and up converter 202 where its amplitude is modulated in response to a signal R(t) also received through the backplane 118 from the pulse generator module 121. The signal R(t) defines the envelope, and therefore the bandwidth, of the RF excitation pulse to be produced. It is produced in the module 121 by sequentially reading out a series of stored digital values that represent the desired envelope. These stored digital values may, in turn, be changed from the operator console 100 to enable any desired RF pulse envelope to be produced. The modulator and up converter 202 produces an RF pulse at the desired Larmor frequency at an output 205.

The magnitude of the RF excitation pulse output through line 205 is attenuated by an exciter attenuator circuit 206 which receives a digital command, TA, from the backplane 118. The attenuated RF excitation pulses are applied to the power amplifier 151 that drives the RF coil 152A. For a more detailed description of this portion of the transceiver 122, reference is made to U.S. Pat. No. 4,952,877 which is incorporated herein by reference.

Referring still to FIGS. 1 and 2 the NMR signal produced by the subject is picked up by the receiver coil 152B and applied through the preamplifier 153 to the input of a receiver attenuator 207. The receiver attenuator 207 further amplifies the NMR signal and this is attenuated by an amount determined by a digital attenuation signal (RA) received from the backplane 118. The receive attenuator 207 is also turned on and off by a signal from the pulse generator module 121 such that it is not overloaded during RF excitation.

The received NMR signal is at or around the Larmor frequency, which in the preferred embodiment is around 63.86 MHz for 1.5 Tesla and 21.28 MHz for 0.5 Tesla. This high frequency signal is down converted in a two step process by a down converter 208 which first mixes the NMR signal with the carrier signal on line 201 and then mixes the resulting difference signal with the 2.5 MHz reference signal on line 204 The resulting down converted NMR signal on line 212 has a maximum bandwidth of 125 kHz and it is centered at a frequency of 187.5 kHz. The down converted NMR signal is applied to the input of an analog-to-digital (A/D) converter 209 which samples and digitizes the analog signal at a rate of 250 kHz. The output of the A/D converter 209 is applied to a digital detector and signal processor 210 which produce 16-bit in-phase (I) values and 16-bit quadrature (Q) values corresponding to the received digital signal. The resulting stream of digitized I and Q values of the received NMR signal is output through backplane 118 to the memory module 160 to form a one-dimensional array of complex k-space data.

To preserve the phase information contained in the acquired complex k-space data, both the modulator and up converter 202 in the exciter section and the down converter 208 in the receiver section are operated with common signals. More particularly, the carrier signal at the output 201 of the frequency synthesizer 200 and the 2.5 MHz reference signal at the output 204 of the reference frequency generator 203 are employed in both frequency conversion processes. Phase consistency is thus maintained and phase changes in the detected NMR signal accurately indicate phase changes produced by the excited spins. The 2.5 MHz reference signal as well as 5, 10 and 60 MHz reference signals are produced by the reference frequency generator 203 from a common 20 MHz master clock signal. The latter three reference signals are employed by the frequency synthesizer 200 to produce the carrier signal on output 201. For a more detailed description of the receiver, reference is made to U.S. Pat. No. 4,992,736 which is incorporated herein by reference.

While the present invention may be employed in clinical applications where oscillatory stress is produced by the subject itself, in the preferred embodiments described herein a separate transducer 130 is employed to apply an oscillatory stress.

Figure 5:
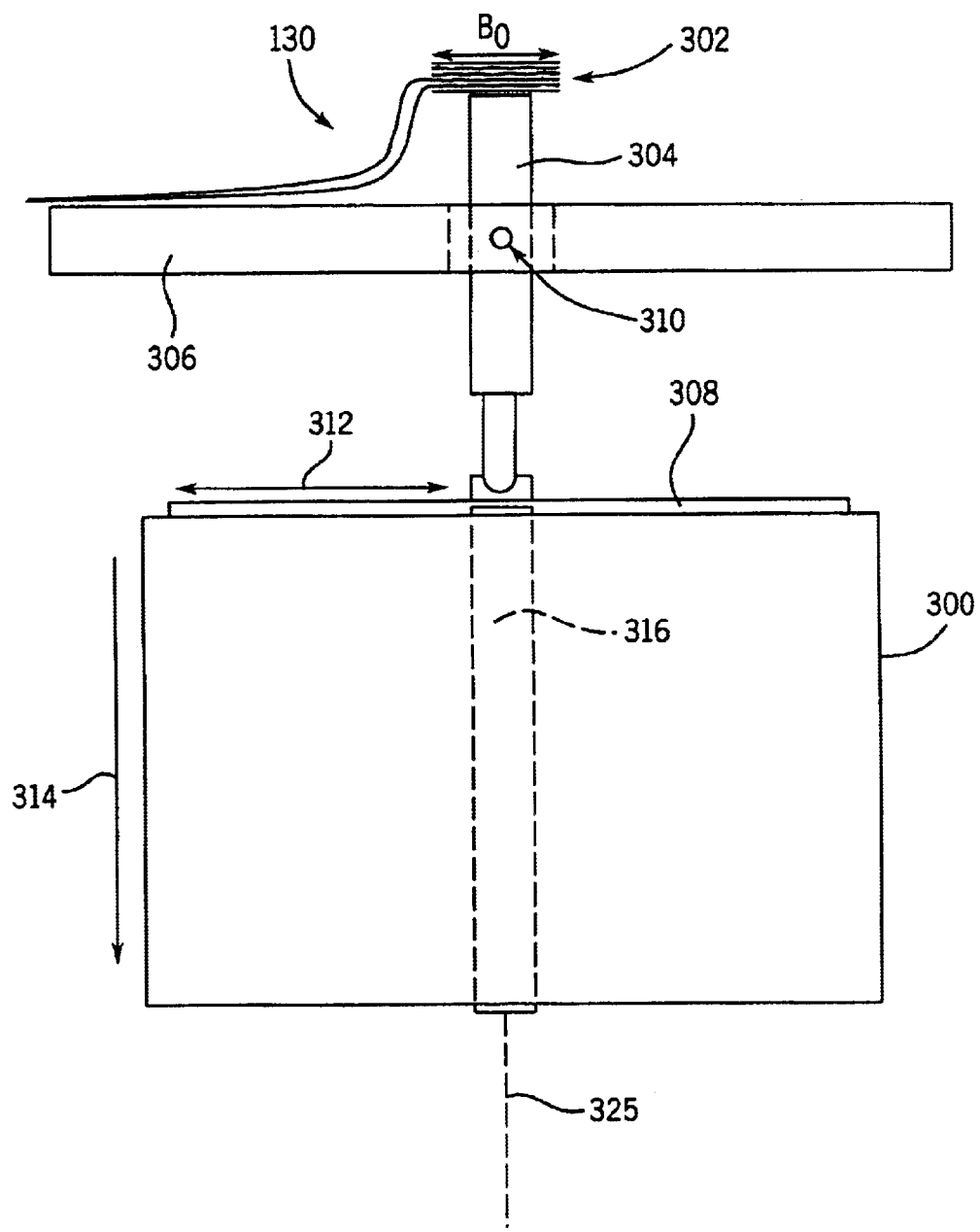
FIG. 5 is an elevation view of a transducer used to produce an oscillatory stress in a subject placed in the MRI system of FIG. 1.

Referring particularly to FIG. 5, a transducer 130 for applying an oscillating stress to tissue 300 includes a drive coil 302 mounted to one end of a drive shaft 304 that is mounted for pivotal rotation to a stationary support bar 306. The other end of the drive shaft 304 connects to a contact plate 308 which rests on the surface of the tissue 300. The drive coil 302 is comprised of 30 AWG insulated wire wound on an aluminum bobbin, and when an oscillating current is applied to the drive coil 302, the current interacts with the Bo polarizing magnetic field to move the upper end of the drive shaft 304 back and forth at the drive current frequency. As a result, the drive shaft 304 pivots about point 310 and its lower end translates back and forth in the direction of arrow 312. The contact plate 308 is thus caused to oscillate in the same direction, and due to the frictional engagement with the surface of tissue 300, it too oscillates. This oscillation produces shear waves which propagate into the tissue in a direction indicated by arrow 314 which is substantially perpendicular to the surface of the tissue 300.

The shear waves propagating into the tissue 300 are imaged according to the preferred embodiment of the invention using a magnetic resonance elastography (MRE) technique based on the teachings in U.S. Pat. Nos. 5,825,186 and 5,592,085. However, rather than acquiring a 2D or 3D image of the tissues 300 which requires multiple acquisitions and minutes of time, a one-dimensional acquisition is performed. As will be explained below, this acquisition includes the RF excitation of a column of spins indicated at 316 which is located in the tissues 300 and oriented in the direction of shear wave propagation.

Two preferred 1D magnetic resonance elastography pulse sequences will now be described. One is a gradient-echo pulse sequence and the other is a spin-echo pulse sequence. Both pulse sequences direct the pulse generator 121 to control the MRI system to acquire the desired MRE data.

Figure 3:
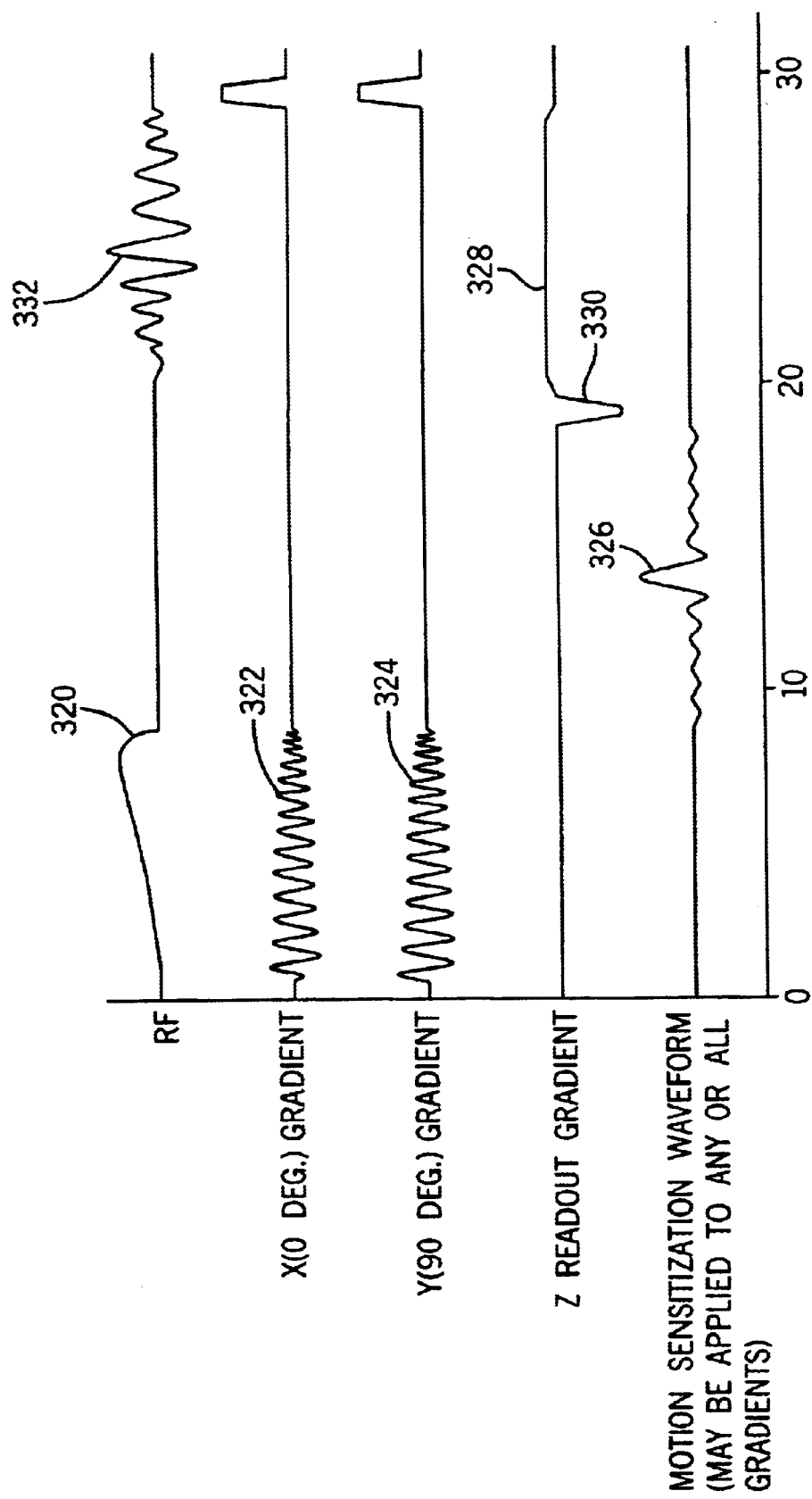
FIG. 3 is a first preferred embodiment of a 1D MRE pulse sequence performed by the MRI system of FIG. 1 to practice the present invention.

Referring particularly to FIG. 3, the preferred gradient-echo 1D MRE pulse sequence employs a two-dimensional selective RF excitation pulse 320 which is produced concurrently with two orthogonal gradients 322 and 324. As described in U.S. Pat. No. 4,312,760 which is incorporated herein by reference, the two gradients 322 and 324 oscillate in amplitude to selectively excite a cylindrical-shaped column of spins disposed along an excitation axis 325 (FIG. 5). This is followed by a motion sensitizing gradient waveform 326 which encodes the excited spins for motion along the gradient axis. This motion encoding gradient axis is preferably directed orthogonal to the column excitation axis 325 to see spin motion perpendicular to the axis 325 along the length of the excited column. The gradient waveform 326 is a broadband time-domain waveform that sensitizes to multiple frequencies simultaneously. In the preferred embodiment this frequency range is from 50 Hz to 1000 Hz so that many different measurements can be conducted without changing the pulse sequence.

A readout gradient 328 is then applied after a dephasing gradient pulse 330 and a gradient NMR echo signal 332 is acquired and digitized as described above to produce a 1D array of complex k-space data. The readout gradient is also directed along the excitation axis 325 to sample along the length of the excited column during signal acquisition.

Figure 4:
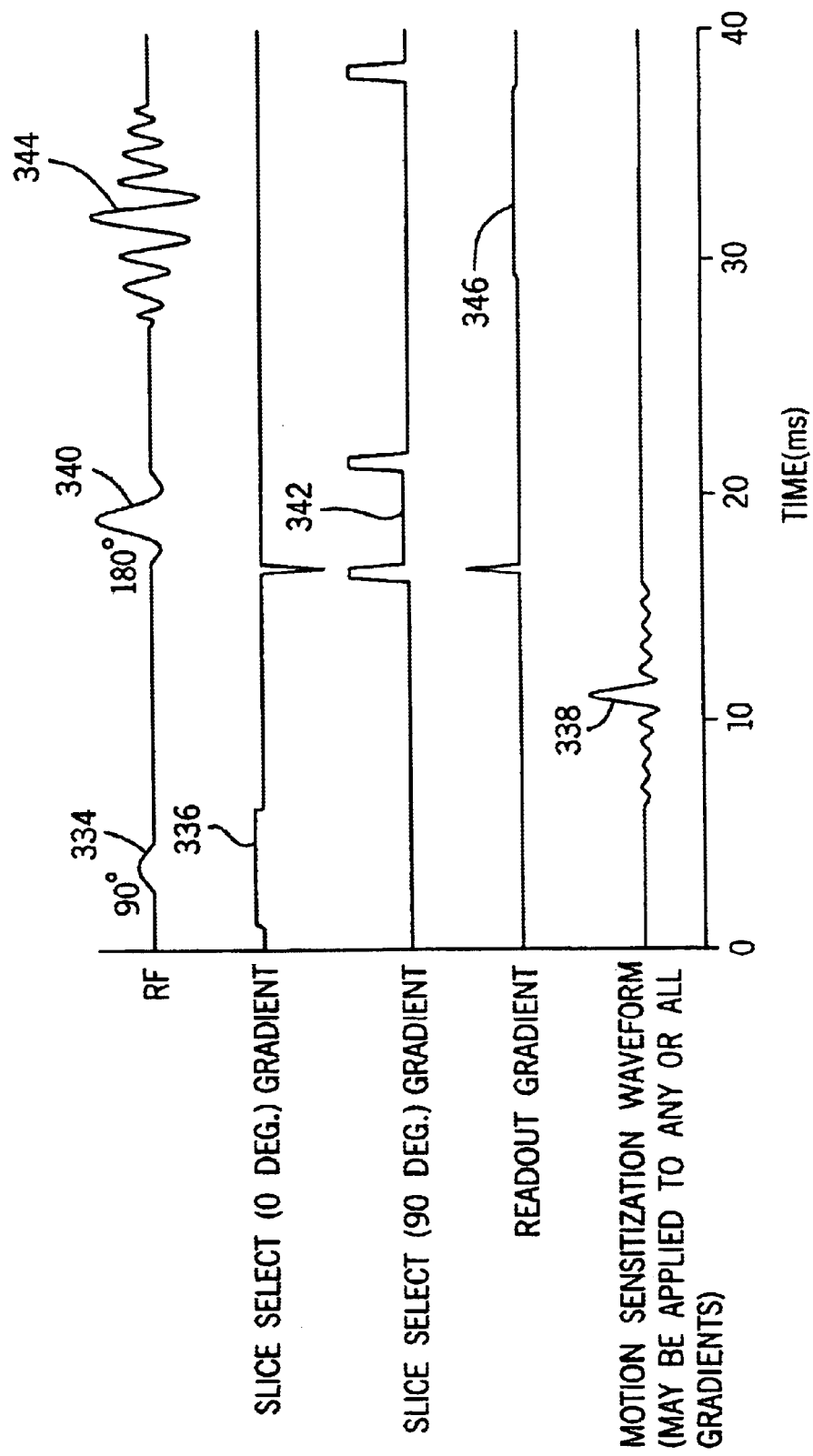
FIG. 4 is a second preferred embodiment of a 1D MRE pulse sequence performed by the MRI system of FIG. 1 to practice the present invention.

Referring particularly to FIG. 4, the 1D spin-echo MRE pulse sequence includes a 90° selective RF excitation pulse 334 which is produced in the presence of a first slice select gradient 336. A motion sensitizing gradient waveform 338 is then applied to sensitize spins for motion in a broad range of frequencies as described above for waveform 326, and a selective 180° RF refocusing pulse 340 is then applied. A second slice-select gradient pulse 342 is produced concurrently with the refocusing pulse 340 to select a slice that is perpendicular to the slice excited by RF pulse 334. The spins located in the column formed by the intersection of the two selected slices refocus and produce a spin-echo NMR signal 344. The spin-echo NMR signal is acquired in the presence of a readout gradient 346 and digitized as described above to produce a 1D array of complex k-space data.

The two slice select gradients 336 and 342 are oriented perpendicular to each other and perpendicular to the excitation axis 325 of the excited column. Their values determine the location of their intersection and hence the location of the excited column of spins. The readout gradient 346 is preferably aligned with the excitation axis 325, as is the motion sensitizing gradient 338. Although this spin-echo MRE pulse sequence is longer than the gradient-echo MRE pulse sequence of FIG. 3, it produces less gradient coil heating.

Figure 6:
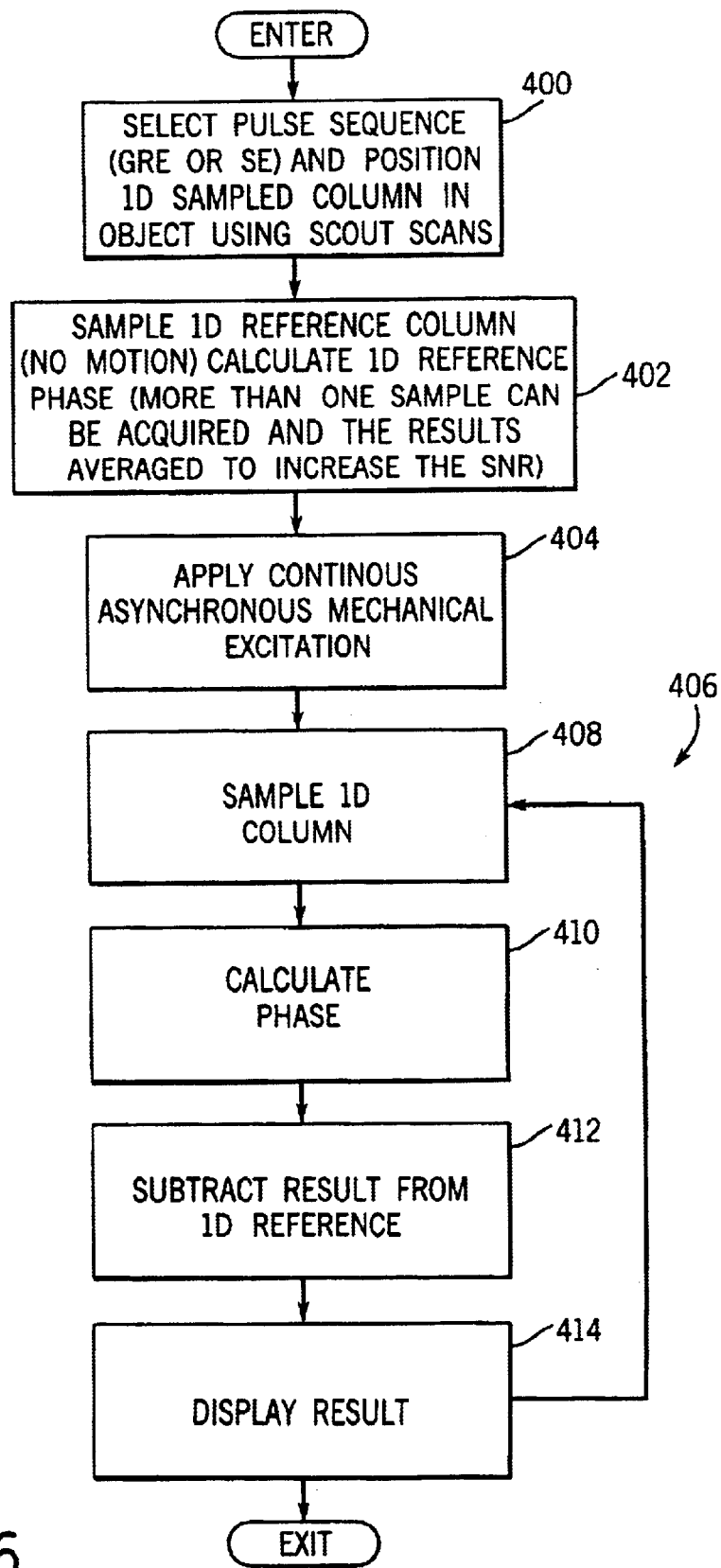
FIG. 6 is a flow chart of the steps used in one preferred method of practicing the present invention using either of the pulse sequences in FIGS. 3 and 4.

Either of the above pulse sequences may be employed to produce real time MRE images of the shear waves traveling in the tissues 300. Referring particularly to FIG. 6, the desired pulse sequence is selected at process block 400 and the gradient directions are prescribed as discussed above to orient the excitation column 316 in the desired location and direction. Without turning on the transducer 130 a 1D reference image is acquired with the selected MRE pulse sequence at process block 402. The acquired NMR signal is processed by performing a complex Fourier transformation on the 1D array of complex k-space data to produce a 1D complex image. The phase at each sample point in the 1D complex image is then calculated to produce a 1D reference phase image: $\phi_R = \tan^{-1} I/Q$, where I and Q are the components of the complex image value at each pixel.

As indicated at process block 404, the transducer 130 is then energized to produce the desired motion waveform. In this embodiment of the invention the motion sensitizing gradient (326 or 338) is not synchronized with the signal driving the transducer 130 and the transducer 130 is said to be "asynchronously" excited. A loop indicated generally at 406 is then entered in which 1D MRE images are acquired, reconstructed and displayed in real time.

As indicated by process block 408, the first step in this loop 406 is to acquire the NMR signal using the selected MRE pulse sequence. A complex Fourier transformation of the acquired and digitized NMR signal is then performed and the phase at each sample point in the resulting 1D complex image is calculated at process block 410: $\phi_A = \tan^{-1} I/Q$. As indicated at process block 412, the resulting 1D phase image $\phi_A$ is then subtracted from the 1D reference phase image $\phi_R$ and the resulting 1D phase difference image ($\phi_i = \phi_R - \phi_A$) is displayed at process 414. The system then loops back and acquires and processes another 1D phase difference image ($\phi_{i+1}$) which is added to the display. Further 1D phase difference images are produced until the process exits at the direction of the operator. Depending on which MRE pulse sequence is used, 1D phase difference images ($\phi_i$) are produced at a frame rate of 10 to 20 frames per second. The operator is thus provided with what are perceived as real time MRE images.

Figure 8:
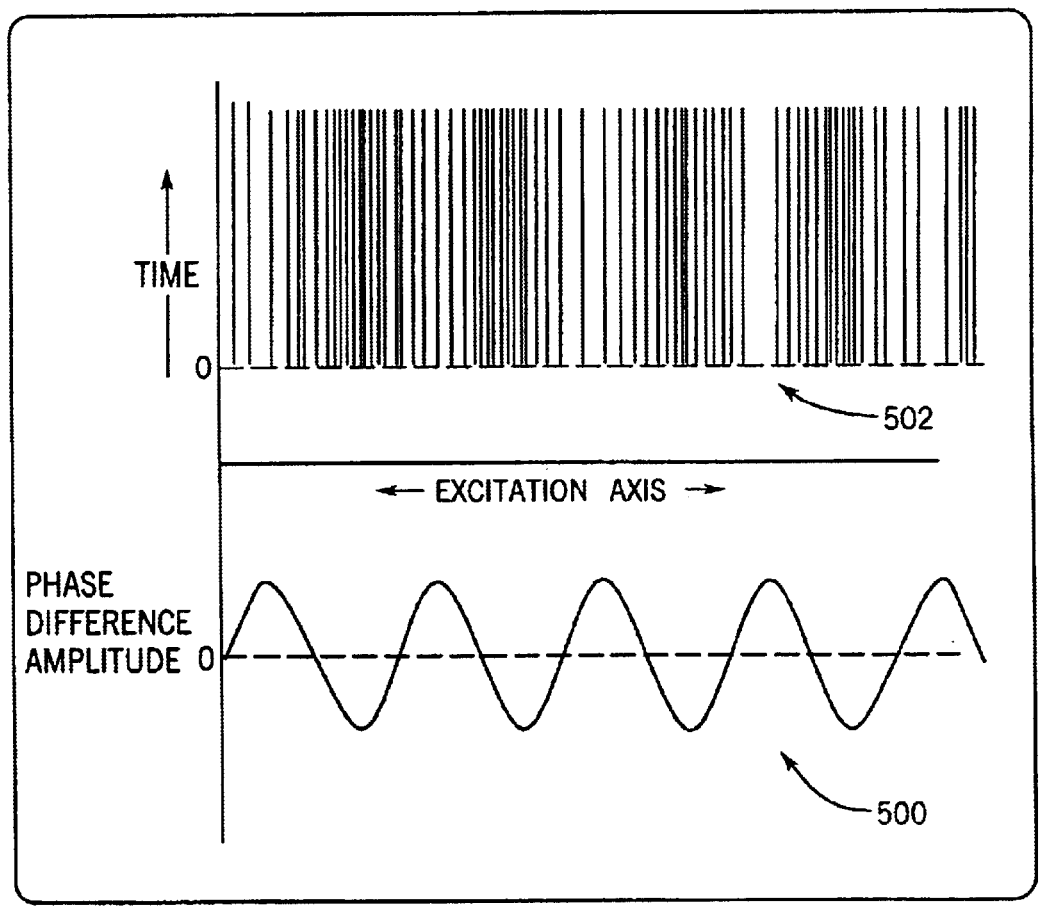
FIG. 8 is a pictorial representation of the preferred rendering of the images produced by the present invention on a display.

The preferred display of the real time 1D MRE images is shown in FIG. 8. It includes a graphic display 500 in which the phase difference amplitude is plotted as a function of location along the excitation axis 325. This waveform 500 is continuously changing in real time as it is updated. A "waterfall" image 502 is also produced from the phase difference images $\phi_i$. This is a 2D image formed by color coding the phase values in each 1D phase difference image $\phi_i$ and displaying it as one line in the image 502 disposed along the excitation axis 325. For example, the pixel color in each 1D phase difference image $\phi_i$ is modulated using a look up table that relates phase difference amplitude to color. As each 1D frame is produced, it is added to the waterfall image 502 and the oldest line is scrolled off the display. The graphic plot 500 thus provides a near instantaneous indication of the signal phase caused by the propagating shear wave in tissue 300, and the waterfall image 502 provides a short historical record.

Another technique for providing real time measurement of the tissue mechanical properties is what we call the "virtual hydrophone". The user selects a location along the excitation axis 325 and the amplitude of the phase of the 1D phase difference image $\phi_i$ at the corresponding location therein is monitored and used to produce an audible tone. Because the phase amplitude information is only updated at a rate of 10 to 20 times per second, however, one cannot simply sample at one location and play the phase amplitude back in real time. For example, the Nyquist criteria holds that a sample rate of 20 times per second at one location will only reproduce signals up to 10 Hz. To overcome this limitation and reproduce frequencies in the 50 Hz to 1000 Hz range, a plurality of successive phase amplitude samples centered on the desired location are played back during the sampling interval. For example, if the sampling rate is 20 Hz, the sampling interval is:

$I = 1/f = 1/20 = 50$ ms.

The number of samples selected for playback during this interval is determined by the distance the shear wave propagates through the subject during this sampling interval. This distance is measured and the number of samples along the excitation axis that span this distance are selected. The values at these successive sample locations are repeatedly acquired and then applied to a digital-to-analog converter in succession over the following sampling interval. The result is the reproduction of an audio signal that represents the frequency of the shear wave in the vicinity of the selected location.

In the preferred embodiments described above, the MRE pulse sequences of FIGS. 3 and 4 employ broadband motion sensitization gradients which enable the transducer 130 to be operated asynchronously. In another preferred embodiment the operation of the transducer 130 is synchronized with the application of the motion sensitizing gradient in the MRE pulse sequence. This synchronous embodiment of the invention is useful when multiple acquisitions are combined for the purpose of improving the signal-to-noise ratio of the image. As described in the above-cited U.S. Pat. No. 5,592,085, in this embodiment the pulse generator module 121 produces sync pulses as it generates the sensitizing gradient waveform, and these are applied to the wave generator 129 (FIG. 1) to synchronize the phase of the signal driving the transducer 130 with the phase of the sensitizing gradient.

Figure 7:
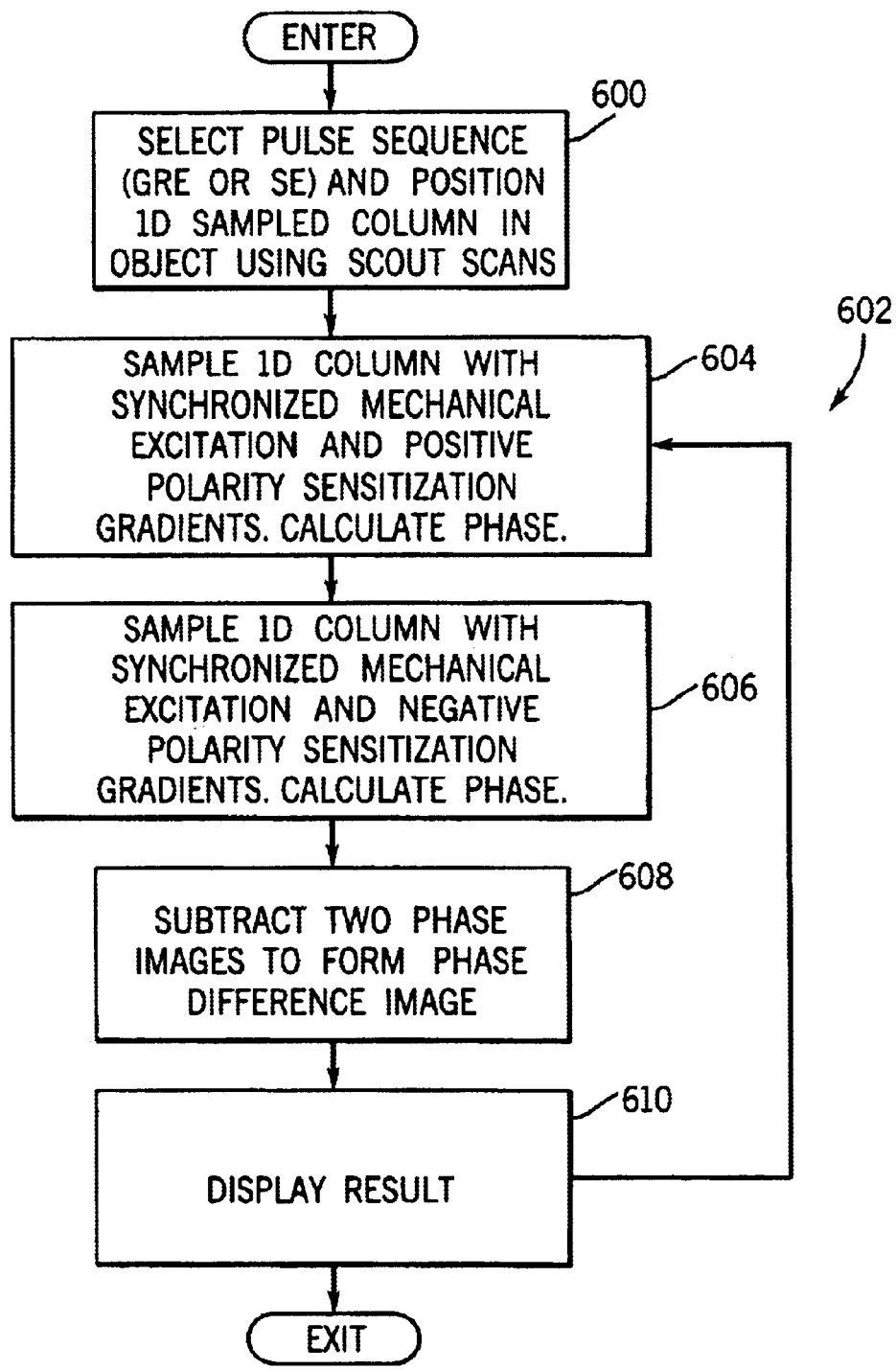
FIG. 7 is a flow chart of the steps used in a second preferred method of practicing the present invention.

When the "synchronized" MRE pulse sequence is used the procedure for acquiring the MRE data is different. As indicated at process block 600 in FIG. 7, the desired synchronous MRE pulse sequence is selected and scout scans are performed with it to precisely locate and align the excitation column with the particular tissues to be imaged. A loop indicated generally at 602 is then entered in which MRI data is acquired and displayed in real time. When the synchronized MRE pulse sequence is used the transducer 130 remains energized and two acquisitions are performed during each iteration of the loop 602. As indicated by process block 504, a first acquisition is performed with the selected 1D MRE pulse sequence synchronized to be "positively" motion sensitized with the mechanical motion produced by the transducer 130. The acquired 1D array of complex k-space data is Fourier transformed to produce a 1D complex image array and the phase at each sample point is calculated as described above to form a first phase image $\phi_R$. The phase of the sinusoidal motion sensitizing gradient waveform is then switched 180° with respect to the transducer drive signal and a second acquisition is performed as indicated at process block 606. The acquired 1D array of complex k-space data is Fourier transformed and the phase of the resulting 1D image is calculated to form a second phase array $\phi_A$. As indicated at process block 068, the two resulting 1D phase images are then subtracted to form a 1D phase difference image $\phi_i = \phi_R - \phi_A$. This phase difference image $\phi_i$ is displayed at process block 610 in the same manner as described above for the asynchronous MRE method.

With the present invention one can continuously image shear waves in tissues at different frequencies without modifying or stopping the pulse sequence. The motion sensitizing gradient waveforms 326 and 338 have a frequency spectrum that contains increasing energy at higher frequencies to compensate for the frequency response of tissues to applied stress. The frequency of the transducer 130 can be changed from 50 Hz to 1000 Hz at random times during the experiment and the resulting shear waves produced in the target tissues observed in real time on the display. The excitation column location and orientation can also be moved around to examine how the shear waves propagate through different tissues. This requires the modification of the gradient waveforms that locate the excitation column in the above-described pulse sequences.

What is claimed is:

1. A method for producing an NMR image of a subject which is affected by spin motion, the steps comprising:
   a) applying a polarizing magnetic field to the subject;
   b) applying an RF excitation field to the subject to produce transverse magnetization of spins in an excitation column oriented along an excitation axis;
   c) applying a magnetic field gradient to the subject to motion sensitize the transverse magnetization, the magnetic field gradient waveform being shaped to contain a range of frequencies that includes a frequency at which the transversely magnetized spins change their direction of motion;
   d) acquiring an NMR signal from the excitation column;
   e) reconstructing a one-dimensional image by Fourier transforming the acquired NMR signal; and
   f) producing a one-dimensional phase image from the reconstructed one-dimensional image.

2. The method as recited in claim 1 in which steps a)–f) are repeated to acquire and reconstruct additional one-dimensional phase images in substantially real time.

3. The method as recited in claim 1 which includes:
   g) setting the spins in oscillatory motion with a transducer driven by a signal of a desired frequency;
   h) repeating steps a)–f) to acquire and reconstruct a second phase image; and
   i) subtracting the first and second phase images to produce a phase difference image.

4. A The method as recited in claim 3 in which steps g)–i) are repeated to produce a plurality of phase difference images in substantially real time.

5. A method for producing an NMR image of a subject which is affected by spin motion, the steps comprising:
   a) applying a polarizing magnetic field to the subject:
   b) applying an RF excitation field to the subject to produce transverse magnetization of spins in an excitation column oriented along an excitation axis:
   c) applying a magnetic field gradient to the subject to motion sensitize the transverse magnetization, the magnetic field gradient waveform being shaped to contain a range of frequencies that includes a frequency at which the transversely magnetized spins change their direction of motion;
   d) acquiring an NIVIR signal from the excitation column:
   e) reconstructing an image by Fourier transforming the acquired NMR signal; and
   f) producing a phase image from the reconstructed image;
   g) repeating steps a)–f) to acquire and reconstruct additional phase images in substantially real time; and
   in claim 2 in which each phase image is displayed as a line which is color coded according to the phase at locations along the excitation axis.

6. The method as recited in claim 5 in which the color coded lines produced by a plurality of sequentially produced phase images are rendered side-by-side to produce a waterfall image.

7. The method as recited in claim 6 in which the most recently acquired phase image is also rendered as a graphic waveform on the display.

8. A method for producing an NMR image of a subject which is affected by spin motion, the steps comprising:
   a) applying a polarizing magnetic field to the subject;
   b) applying an RE excitation field to the subject to produce transverse magnetization of spins in an excitation column oriented along an excitation axis;
   c) applying a magnetic field gradient to the subject to motion sensitize the transverse magnetization, the magnetic field gradient waveform being shaped to contain a range of frequencies that includes a frequency at which the transversely magnetized spins change their direction of motion;
   d) acquiring an NMR signal from the excitation column;
   e) reconstructing an image by Fourier transforming the acquired NMR signal; and
   f) producing a phase image from the reconstructed image;
   g) setting the spins in oscillatory motion with a transducer driven by a signal of a desired frequency;
   h) repeating steps a)–f) to acquire and reconstruct a second phase image:
   i) subtracting the first and second phase images to produce a phase difference image:
   j) repeating steps g)–i) to produce a plurality of phase difference images in substantially real time; and
   in which each phase difference image is a line which is color coded along its length according to the phase at locations along the excitation axis, and a plurality of the color coded lines are rendered side-by-side to produce a waterfall image.

9. A method for producing an NMR image of a subject which comprises:
   a) applying a polarizing magnetic field to the subject;
   b) applying an oscillatory stress to the subject to impart motion to spins therein;
   c) applying an RF excitation field to the subject in the presence of a gradient field to produce transverse magnetization of spins in an excitation column oriented along an excitation axis in the subject;
   d) applying a motion sensitizing gradient having an amplitude component which oscillates in synchronism with the applied oscillatory stress;
   e) reconstructing a one-dimensional image by Fourier transforming the acquired NMR signal;
   f) producing a first one-dimensional phase image from the one-dimensional image;
   g) repeating steps a)–e) with the phase of the motion sensitizing gradient reversed to produce a second one-dimensional image; and
   h) producing a one-dimensional phase difference image by subtracting said first and second one-dimensional phase images.

10. The method as recited in claim 9 in which steps a)–h) are repeated to produce a plurality of one-dimensional phase difference images in substantially real time.

11. The method as recited in claim 10 which includes:
    displaying each phase difference image by plotting the phase difference amplitude as a function of distance along the excitation axis.

12. The method as recited in claim 10 which includes:
    producing an audio signal from the phase difference amplitudes at a designated location in each of a succession of one-dimensional phase difference images.

13. The method as recited in claim 9 in which the motion sensitizing gradient is oriented in a direction substantially perpendicular to the excitation axis.

14. A method for producing an NMR image of a subject which comprises:

a) applying a polarizing magnetic field to the subject;

b) applying an oscillatory stress to the subject to impart motion to spins therein;

c) applying an RF excitation field to the subject in the presence of a gradient field to produce transverse magnetization of spins in an excitation column oriented along an excitation axis in the subject;

d) applying a motion sensitizing gradient having an amplitude component which oscillates in synchronism with the applied oscillatory stress;

e) reconstructing a one-dimensional image by Fourier transforming the acquired NMR signal;

f) producing a first one-dimensional phase image from the one-dimensional image;

g) repeating steps a)–e) with the phase of the motion sensitizing gradient reversed to produce a second one-dimensional image;

h) producing a one-dimensional phase difference image by subtracting said first and second one-dimensional phase images;

i) repeating steps a)–h) to produce a plurality of one-dimensional phase difference images in substantially real time; and in which each phase difference image is rendered on a display as a line which is color coded along its length according to the phase at locations along the excitation axis, and a plurality of the color coded lines are rendered side-by-side to produce a waterfall image.

15. A method for producing an NMR image of a subject which is affected by spin motion, the steps comprising:

a) applying a polarizing magnetic field to the subject;

b) applying an RF excitation field to the subject to produce transverse magnetization of spins in an excitation column oriented along an excitation axis;

c) applying a magnetic field gradient to the subject to motion sensitize the transverse magnetization, the magnetic field gradient waveform being shaped to contain a selected frequency;

d) acquiring an NMR signal from the excitation column;

e) reconstructing a one-dimensional reference image by Fourier transforming the acquired NMR signal;

f) producing a one-dimensional reference phase image from the reconstructed one-dimensional reference image;

g) applying an oscillatory stress to the subject to impart motion in the transversely magnetized spins at said selected frequency;

h) repeating steps a)–d) to acquire a second NMR signal;

i) reconstructing a one-dimensional image by Fourier transforming the acquired second NMR signal;

j) producing a one-dimensional phase image from the reconstructed one-dimensional image;

k) producing a one-dimensional phase difference image by calculating the difference between the one-dimensional phase image and the one-dimensional reference phase image.

16. The method as recited in claim 15 in which steps g)–k) are repeated to acquire and reconstruct additional one-dimensional phase difference images in substantially real time.

17. The method as recited in claim 16 which includes:

producing an audio signal from the phase difference amplitudes at designated locations in each of a succession of phase difference images.

18. A method for producing an NMR image of a subject which is affected by spin motion, the steps comprising:

a) applying a polarizing magnetic field to the subject;

b) applying an RF excitation field to the subject to produce transverse magnetization of spins in an excitation column oriented along an excitation axis;

c) applying a magnetic field gradient to the subject to motion sensitize the transverse magnetization, the magnetic field gradient waveform being shaped to contain a selected frequency;

d) acquiring an NMR signal from the excitation column;

e) reconstructing a reference image by Fourier transforming the acquired NMR signal;

f) producing a reference phase image from the reconstructed reference image;

g) applying an oscillatory stress to the subject to impart motion in the transversely magnetized spins at said selected frequency;

h) repeating steps a)–d) to acquire a second NMR, signal:

i) reconstructing an image by Fourier transforming the acquired second NMR signal;

j) producing a phase image from the reconstructed image;

k) producing a phase difference image by calculating the difference between the phase image and the reference phase image;

l) repeating steps a)–k) to acquire and reconstruct additional chase difference images in substantially real time; and in which each phase difference image is displayed as a line which is color coded according to the phase difference at locations along the excitation axis.

19. The method as recited in claim 18 in which the color coded lines produced by a plurality of sequentially produced phase difference images are rendered side-by-side to produce a waterfall image.

20. The method as recited in claim 19 in which the most recently acquired phase difference image is also rendered as a graphic waveform on the display.

* * * * *